US012580362B2

(12) United States Patent
Hatori et al.

(10) Patent No.: US 12,580,362 B2
(45) Date of Patent: Mar. 17, 2026

(54) LIGHT EMITTING MODULE

(71) Applicant: KYOCERA SOC Corporation,
Yokohama (JP)

(72) Inventors: Masami Hatori, Yokohama (JP);
Satoshi Nakao, Yokohama (JP); **Isao
Masukawa**, Yokohama (JP)

(73) Assignee: KYOCERA SOC Corporation,
Yokohama (JP)

( * ) Notice: Subject to any disclaimer, the term of this
patent is extended or adjusted under 35
U.S.C. 154(b) by 530 days.

(21) Appl. No.: 18/117,010

(22) Filed: Mar. 3, 2023

(65) Prior Publication Data

US 2023/0307884 A1     Sep. 28, 2023

(30) Foreign Application Priority Data

Mar. 23, 2022     (JP) ................................. 2022-046313

(51) Int. Cl.

| | |
|---|---|
| *H01S 5/02255* | (2021.01) |
| *H01S 5/00* | (2006.01) |
| *H01S 5/024* | (2006.01) |
| *H01S 5/0683* | (2006.01) |

(52) U.S. Cl.
CPC ........ *H01S 5/02255* (2021.01); *H01S 5/0014*
(2013.01); *H01S 5/02415* (2013.01); *H01S
5/06837* (2013.01); *H01S 5/0683* (2013.01)

(58) Field of Classification Search
CPC ............. H01S 5/02255; H01S 5/02415; H01S
5/0683; H01S 5/06837
See application file for complete search history.

(56) References Cited

U.S. PATENT DOCUMENTS

| | | | | |
|---|---|---|---|---|
| 5,369,661 | A | * | 11/1994 | Yamaguchi ......... H01S 3/09415 |
| | | | | 372/71 |
| 10,298,325 | B1 | | 5/2019 | Birnbaum et al. |
| 10,928,597 | B2 | | 2/2021 | Kihara |

(Continued)

FOREIGN PATENT DOCUMENTS

| | | | |
|---|---|---|---|
| CN | 207067543 | * | 3/2018 |
| CN | 114077048 A | | 2/2022 |

(Continued)

OTHER PUBLICATIONS

Japanese Office Action, corresponding to Japanese Patent Application No. 2022-046313, Jan. 25, 2024, 8 pages.

*Primary Examiner* — Michael Carter
(74) *Attorney, Agent, or Firm* — Harter Secrest & Emery
LLP; Timothy W. Menasco, Esq.

(57) ABSTRACT

A light emitting module includes a semiconductor laser, a collimating lens for that collimates light beam output from the semiconductor laser, a prism pair including two substantially triangular-plate-shaped prisms, each passing the light beam between two end surfaces on both sides of one apex angle to refract the light beam, and the prisms being sequentially arranged on an optical path of the light beam in such a manner that the orientations of apex angles of the prisms are opposite to each other, and a rotary stage configured to hold the prism pair and to be rotatable about a rotation axis C extending in a prism thickness direction in such a manner that an incident angle of the light beam entering the prism positioned on the upstream side of the optical path is changed.

7 Claims, 5 Drawing Sheets

100

(56)                     References Cited

U.S. PATENT DOCUMENTS

2006/0062262 A1 *   3/2006   Kubota ................... H01S 5/141
                                                            372/20
2006/0126690 A1 *   6/2006   Kido ...................... G02B 6/425
                                                            372/43.01
2018/0173000 A1 *   6/2018   Rothberg ............... G02B 7/005

FOREIGN PATENT DOCUMENTS

JP          S 47-37648   A      12/1972
JP          2002-168770  A       6/2002
JP          2002-178182  A       6/2002
JP          2002-323662  A      11/2002
JP          2004-241438  A       8/2004
JP          2006-086429  A       3/2006
JP          2006099902   A       4/2006
JP          2010-153584  A       7/2010
JP          2010153584        *  7/2010
JP          5292464      B2      9/2013
JP          2020042061   A       3/2020
JP          2021-197390  A      12/2021
WO          2017/209277  A1     12/2017

* cited by examiner

REFERENCE PLANE

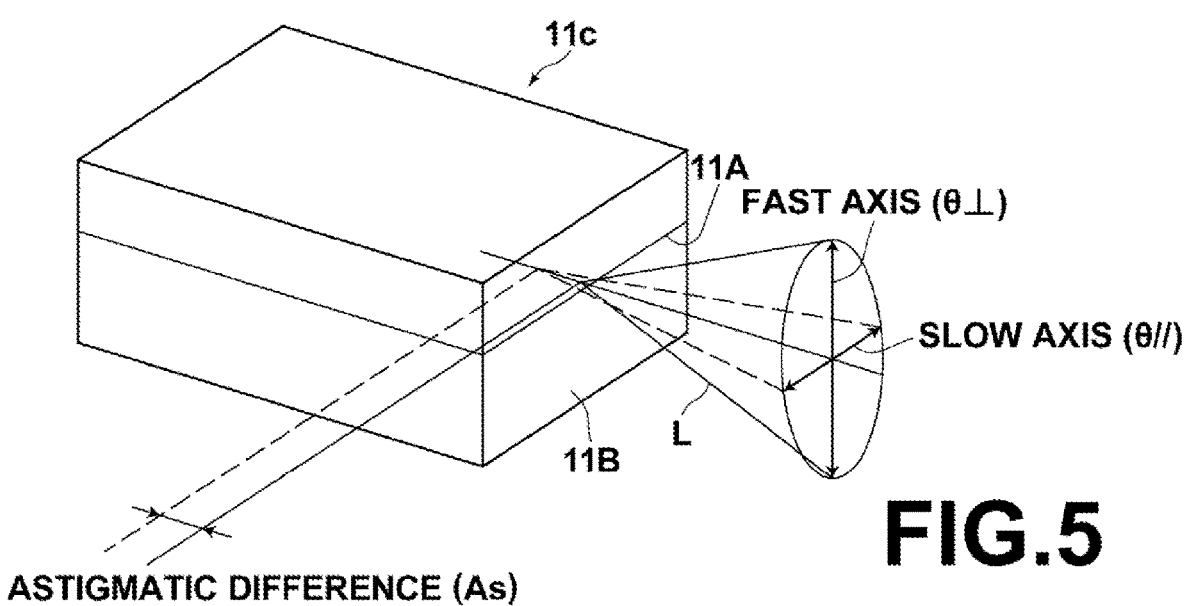
FIG.5
FIG.6A  FIG.6B  FIG.6C  FIG.6D
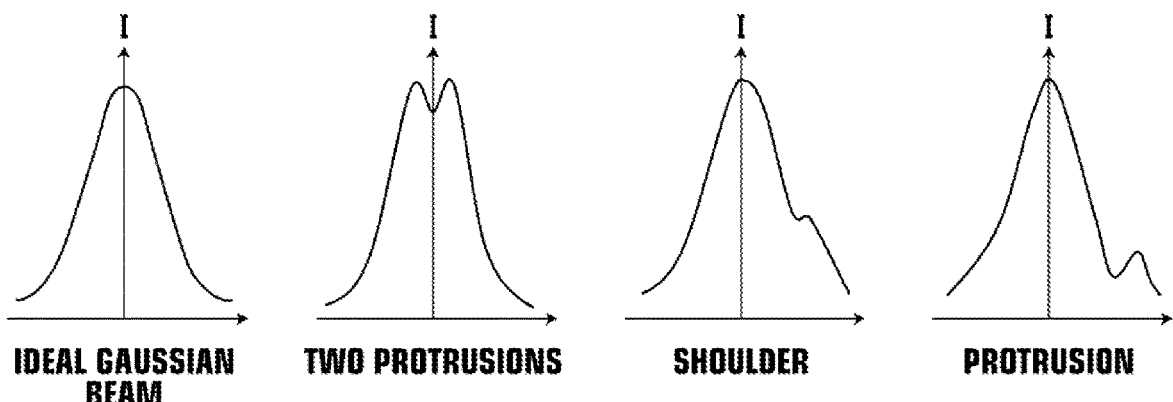

FIG.7A
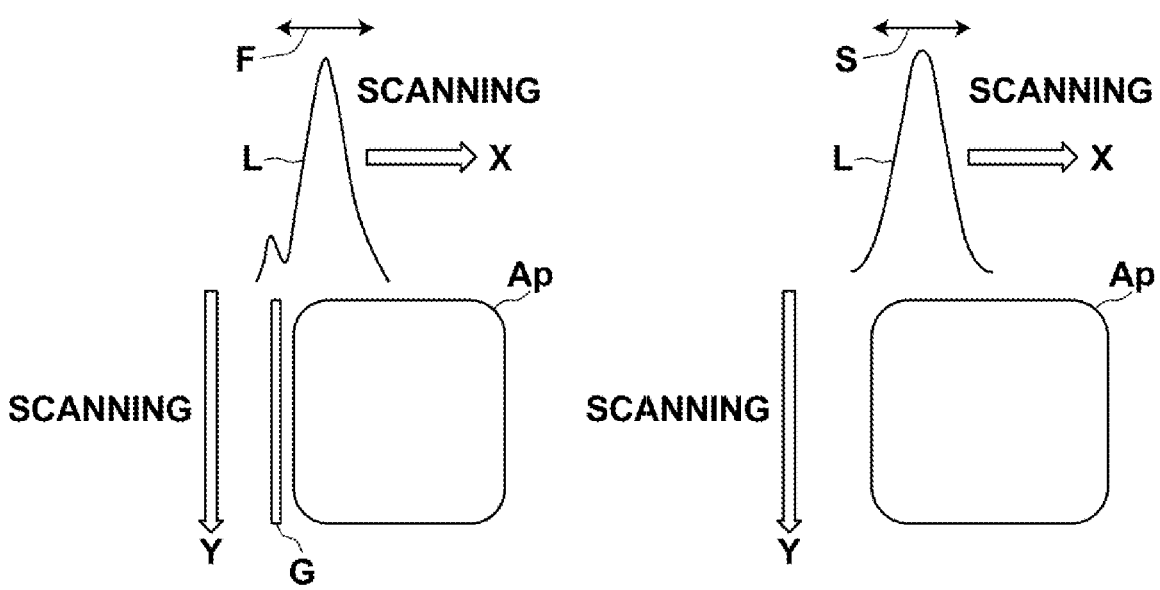
FIG.7B
FIG.8
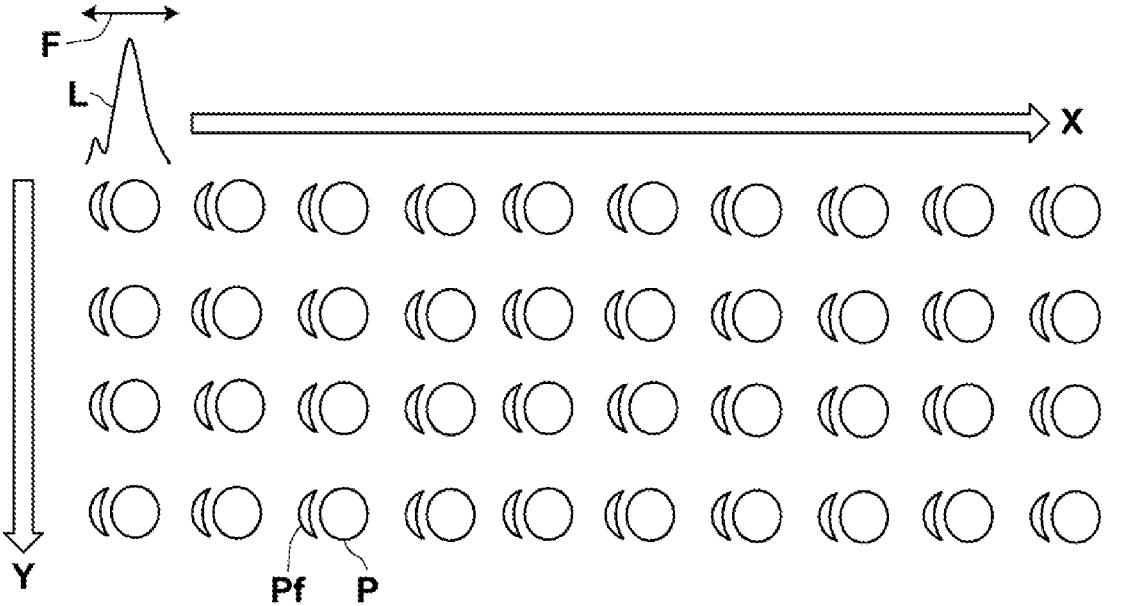

LIGHT EMITTING MODULE

CROSS-REFERENCE TO RELATED APPLICATIONS

This application is based on Japanese Patent Application No. 2022-046313 filed on Mar. 23, 2022, the contents of which are incorporated herein by reference.

BACKGROUND

The present disclosure relates to a light emitting module for emitting light beam, and particularly to a light emitting module using a semiconductor laser as a light source.

Conventionally, various analysis apparatuses and measuring instruments for measuring and analyzing the structure, characteristics and number of analytes and the like by irradiating minute analytes, such as cells and bacteria, with light beam, and by detecting scattered light and fluorescence induced by the irradiation by a photodetector are known. In this kind of analysis apparatus, a module including a light source and optical elements, such as a lens for focusing light beam output from the light source, is often used. Japanese Unexamined Patent Publication No. 2020-42061 (Document 1) discloses an example of such a light emitting module.

When a reduction in the size of the light emitting module is requested, a semiconductor laser (laser diode) is often used as the light source. In many cases, light beam emitted from this kind of light emitting module are focuses into a small spot to be used. In the aforementioned analysis apparatus, accurate control of a focusing position of the light beam, i.e., the focusing position in a direction orthogonal to the travel direction of the light beam is needed.

Conventionally, to satisfy such a request, an optical system including a movement means for moving a lens in X direction orthogonal to the travel direction of traveling light beam and also in Y direction perpendicular to the X direction has been proposed, as disclosed in Japanese Unexamined Patent Publication No. 2006-99902 (Document 2). The movement means disclosed in Document 2 changes the travel direction (beam orientation) of the light beam by moving a lens, in X and Y directions perpendicular to an optical axis direction Z, through which the light beam pass. As a specific means for moving the lens in the X and Y directions, a moving coil has been proposed.

As a mechanism for satisfying the request, a focal point and optical axis direction adjustment unit and an optical axis adjustment unit, disclosed in Japanese Patent No. 5292464 (Document 3), are also known. The focal point and optical axis direction adjustment unit moves a lens that substantially collimates light beam output from a light source, such as a semiconductor laser, in an optical axis direction and in at least one direction in a plane perpendicular to the optical axis. Meanwhile, the optical axis adjustment unit rotates a plate-type dielectric plate, through which collimated light beam pass, in a plane orthogonal to the optical axis. In other words, a spot position (focal point) of the light beam is adjusted by moving the lens in the optical axis direction, and the orientation of the light beam is shifted by rotating the dielectric plate.

The focal point and optical axis direction adjustment unit and the optical axis adjustment unit disclosed in Document 3 were applied to a light scan type image display apparatus, and the movement means disclosed in Document 2 was applied to an optical apparatus for optical recording/regeneration. It would be also possible to incorporate either of them into a light emitting module, as disclosed in Document 1.

SUMMARY

The present disclosure is directed to provide a light emitting module in which the orientation (travel direction) of light beam is changeable in a relatively simple structure, the beam diameter of the light beam is settable to a predetermined diameter and even if the orientation changes, the beam diameter does not change.

A light emitting module according to an aspect of the present disclosure is a light emitting module including a semiconductor laser, a collimating lens for collimating light beam output from the semiconductor laser in a spread light state, a prism pair including two substantially triangular-plate-shaped prisms, each passing the light beam between two end surfaces on both sides of one apex angle to refract the light beam, and the prisms being sequentially arranged on an optical path of the collimated light beam in such a manner that the orientations of apex angles of the prisms are opposite to each other, and a rotary stage configured to hold the prism pair and to be rotatable about a rotation axis extending in a prism thickness direction in such a manner that an incident angle of the collimated light beam entering a prism positioned on the upstream side of the optical path is changed.

Here, the expression "the orientations of apex angles are opposite to each other" represents a state where when the positions of an apex angle and a base of each prism relative to an optical path of light beam passing through a prism pair are considered, a base of one of the prisms is positioned on the same side of the optical path as the apex angle of the other prism. In the following descriptions, a unit including the aforementioned prism pair and rotary stage will be also referred to as "beam conversion unit".

In the light emitting module of the present disclosure, it is desirable to include a focusing lens for focusing light beam emitted from the prism pair. Further, it is also desirable to include an attenuator for attenuating the light beam emitted from the prism pair. In the light emitting module of the present disclosure, it is desirable to include a temperature adjustment means for a semiconductor laser to change the oscillation wavelength of the semiconductor laser.

In the light emitting module according to an aspect of the present disclosure, a photodetector configured to detect light output from the semiconductor laser is provided, and one of end surfaces of the two prisms, and through which the light beam pass, is used as a reflection surface for guiding the light beam reflected at the end surface to the photodetector.

In the light emitting module according to an aspect of the present disclosure, it is desirable that two sets, each including the prism pair and the rotary stage that holds the prism pair, are arranged along the optical path of the collimated light beam, and that a rotation axis of one of the rotary stages is perpendicular to a direction parallel to a rotation axis of the other rotary stage. When the light emitting module is configured in such a manner, it is particularly desirable that the rotation axis of the one of the rotary stages is parallel to a fast axis or a slow axis of the light beam entering the prism pair.

BRIEF DESCRIPTION OF THE DRAWINGS

FIG. 5 is a schematic diagram illustrating a perspective view of a laser diode chip used in the light emitting module illustrated in FIGS. 4A and 4B.

FIG. 6A is a schematic diagram illustrating an example of a beam profile in a fast axis direction of a laser beam emitted by a semiconductor laser.

FIG. 6B is a schematic diagram illustrating another example of a beam profile in the fast axis direction of the laser beam emitted by the semiconductor laser.

FIG. 6C is a schematic diagram illustrating another example of a beam profile in the fast axis direction of the laser beam emitted by the semiconductor laser.

FIG. 6D is a schematic diagram illustrating another example of a beam profile in the fast axis direction of the laser beam emitted by the semiconductor laser.

FIG. 7A is a schematic diagram for explaining the action of a light emitting module according to a third embodiment of the present disclosure.

FIG. 7B is a schematic diagram for explaining the action of the light emitting module according to the third embodiment of the present disclosure.

FIG. 8 is a schematic diagram for explaining the action of a light emitting module according to a fourth embodiment of the present disclosure.

DETAILED DESCRIPTION OF THE PREFERRED EMBODIMENTS

Hereinafter, embodiments of the present disclosure will be described with reference to drawings.

First Embodiment

Figure 1:
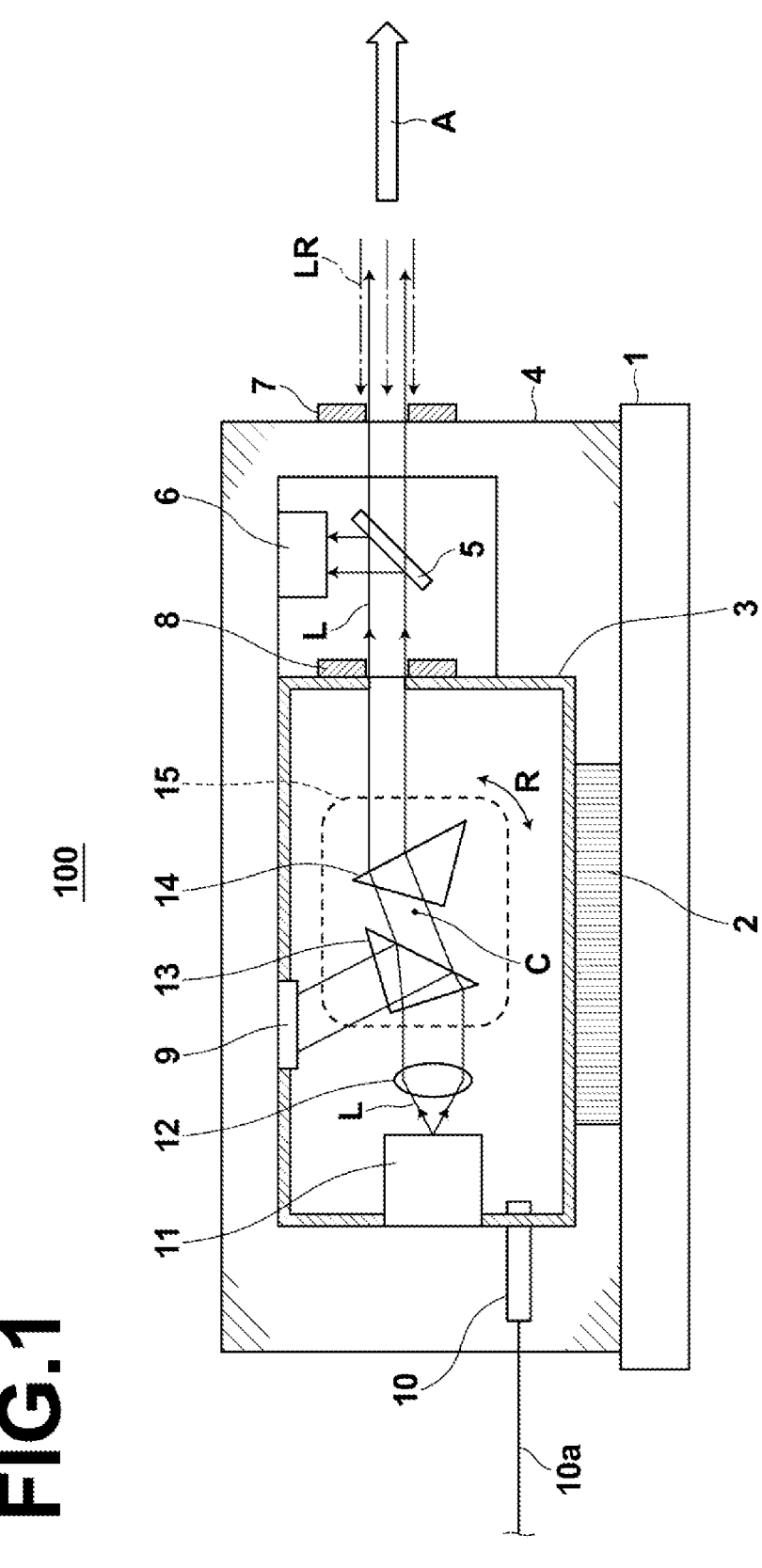
FIG. 1 is a partially-cut side view illustrating the shape of a whole light emitting module according to a first embodiment of the present disclosure.

FIG. 1 is a partially-cut side view illustrating a light emitting module 100 according to a first embodiment of the present disclosure. As illustrated in FIG. 1, the light emitting module 100 includes a base plate 1, a housing 3 attached to the base plate 1 through a Peltier element 2 for adjusting a temperature (a temperature adjustment unit for a semiconductor laser), a cover 4 for covering the housing 3, an attenuator 5 for attenuating a laser beam (light beam) L emitted from the housing 3 toward the right side in FIG. 1 and reflecting a part of the laser beam L toward the upside in FIG. 1, and a terminator 6 for absorbing the laser beam L reflected by the attenuator 5. The terminator 6 is attached to the inner surface of the cover 4.

In some cases, the laser beam L emitted from the cover 4 in the direction of arrow A is reflected by some member, and reflection light LR (indicated by a dot dashed line in FIG. 1) is induced, which is reflected back toward a semiconductor laser 11, as a light source, which will be described later. An aperture plate (diaphragm plate) 7 for blocking the reflection light LR is attached to the outer surface of the cover 4. A similar aperture plate 8 is also attached to the outer surface of the housing 3. Each of the aperture plates 7, 8 is constituted of a light blocking plate member having an opening for excellently passing the laser beam L that is traveling toward the right side in FIG. 1. Compared with the laser beam L, the light intensity distribution of the reflection light LR spreads more widely and weakly from the beam center toward the outside. Therefore, it is possible to effectively block the reflection light LR around the openings of the aperture plates 7, 8.

Next, the structure of the inside of the housing 3 will be described. A semiconductor laser 11, as a light source, a collimating lens 12 for collimating the laser beam (light beam) L output from the semiconductor laser 11 in a spread light state, a first prism 13 and a second prism 14 arranged in this order on the optical path of the collimated laser beam L and a rotary stage 15, onto which these prisms 13, 14 are fixed, are arranged in the housing 3.

Figure 2A:
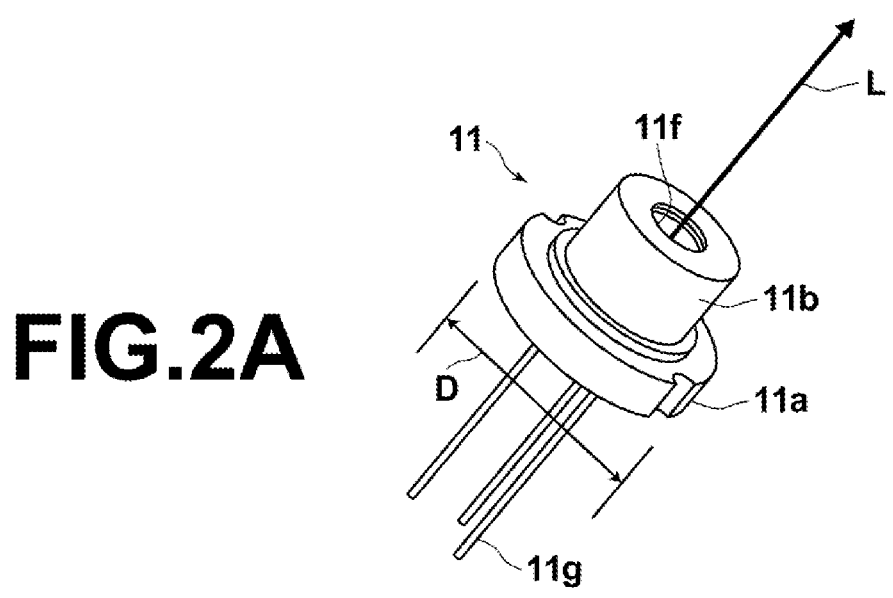
FIG. 2A is a schematic diagram illustrating a perspective view of a semiconductor laser used in the light emitting module illustrated in FIG. 1.
Figure 2B:
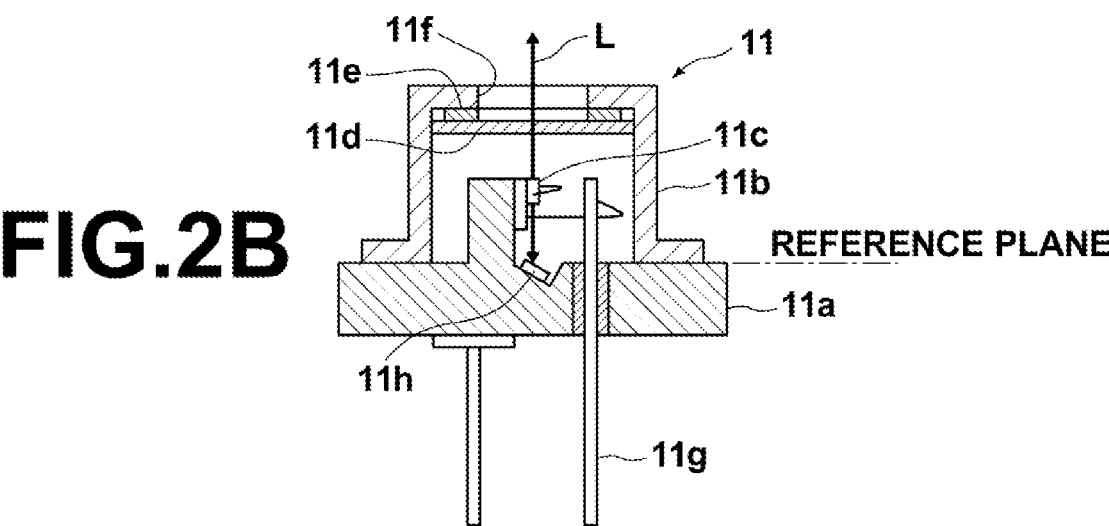
FIG. 2B is a vertical cross section of the semiconductor laser used in the light emitting module illustrated in FIG. 1.

While FIG. 1 schematically illustrates the semiconductor laser 11, FIGS. 2A and 2B illustrate the detailed outer shape and the vertical cross-sectional shape, respectively. As illustrated in FIGS. 2A and 2B, the semiconductor laser 11 basically includes a metal stem 11a having a substantially disk-shaped bottom, a substantially cylindrical metal cap 11b arranged on the metal stem 11a and a laser diode chip 11c fixed onto the top of the metal stem 11a in such a manner to be protected by the metal cap 11b.

The laser beam L output from the laser diode chip 11c passes through a disk-shaped cover glass 11d fixed onto the top of the metal cap 11b, and passes through a central round hole of a ring-shaped low-melting-point glass 11e arranged on the cover glass 11d and a central round hole 11f formed at the upper base of the metal cap 11b to be emitted to the outside of the metal cap 11b. A plurality of leads 11g for supplying electric power to the laser diode chip 11c and a photodiode 11b for detecting backward output light of the laser beam L to control the light output of the laser beam (forward output light) L from the laser diode chip 11c are attached to the metal stem 11a.

Referring back to FIG. 1, the explanation will be continued. Each of the first prism 13 and the second prism 14 is a so-called triangular prism, formed in a substantially triangular plate shape by using optical glass, and refracts the laser beam L by passing the laser beam L between two end surfaces on both sides of one apex angle. The prisms 13, 14, constituting a prism pair, are arranged in this order on the optical path of the collimated laser beam L in such a manner that orientations of apex angles of the prisms are opposite to each other.

Specifically, the first prism 13, which is one of the prisms, is arranged in such a manner that its one apex angle is positioned below the optical path of the laser beam L in FIG. 1 while the second prism 14, which is the other prism, is arranged in such a manner that a similar apex angle is positioned above the optical path of the laser beam L in FIG. 1. In other words, a base of the second prism 14, facing the one apex angle, is positioned below the optical path of the laser beam L in FIG. 1. Alternatively, the one apex angle of the first prism 13 may be positioned above the optical path of the laser beam L in FIG. 1 and the one apex angle of the second prism 14 may be positioned below the optical path of the laser beam L in FIG. 1.

The rotary stage 15, onto which the prism pair is fixed, is rotatable about a rotation axis C in a direction R in FIG. 1. For example, the rotation axis C extends between the prisms 13 and 14 perpendicularly to a depicted plane of FIG. 1 (a paper surface in a printed state, and similar hereinafter). For example, the rotary stage 15 is mechanically coupled to a rotation knob and a gear, which are not illustrated, and rotatable forward and backward in the direction R by rotating the rotation knob by a manual operation. Here, other known mechanisms may be used for rotation of the rotary stage 15. In the present embodiment, the rotary stage 15 has a rectangular plate shape with four rounded corners. However, the shape is not particularly limited, and may be a disk shape, for example.

Specifically, as a mechanism for rotatably holding the rotary stage 15, various known mechanisms are adoptable, such as a mechanism for holding a cylindrical holding shaft concentric with a point indicating a rotation axis C in FIG. 1, and which projects from one surface of the rotary stage 15 (a surface opposite to a surface onto which the prisms 13, 14 are fixed), by a shaft bearing fixed on the housing 3 or a mechanism for holding the cylindrical holding shaft by forming, in the rotary stage 15, a cylindrical through-hole concentric with the point indicating the rotation axis C in FIG. 1 and by inserting the holding shaft through the through-hole to hold the holding shaft on the housing 3 side.

The first prism 13 and the second prism 14 are fixed onto the rotary stage 15 with a predetermined angular positional relationship maintained therebetween. Here, the first prism 13 and the second prism 14 may be attached to the rotary stage 15 in such a manner that the orientation of each of the prisms is adjustable, instead of being fixed onto the rotary stage 15. In that case, after the first prism 13 and the second prism 14 are attached to the rotary stage 15, the angular positional relationship between them is adjustable to satisfy a predetermined relationship. In the following descriptions, a mechanism including the prisms 13, 14 and the rotary stage 15 will be also referred to as "beam conversion unit".

A photodetector 9, such as a photodiode, for detecting light output from the semiconductor laser is attached to the inside of the housing 3. Further, one end surface of the first prism 13 through which the light beam pass, i.e., an end surface on the downstream side in the direction of passage of the laser beam L, through which the laser beam L passes, is used as a reflection surface for guiding the laser beam L reflected at the end surface to the photodetector 9. A thermistor 10 for detecting the temperature of the inside of the housing 3 is attached to the housing 3. A signal indicating a temperature detected by the thermistor 10 is output to the outside through a signal line 10*a*.

Figure 3:
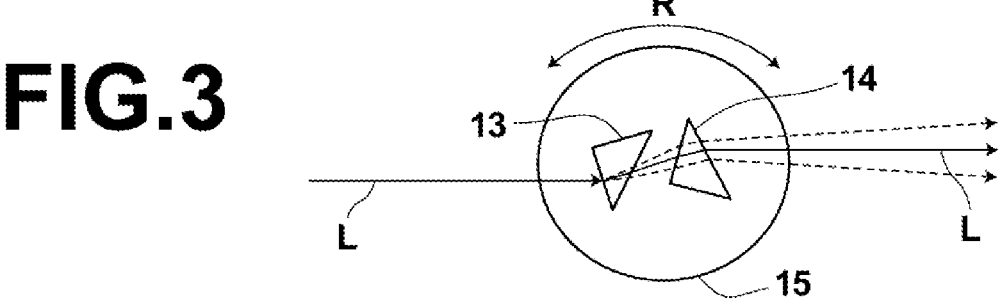
FIG. 3 is a schematic diagram for explaining the action of a beam conversion unit used in the light emitting module illustrated in FIG. 1.

Next, the action of the light emitting module 100 in the present embodiment will be described. When the rotary stage 15 is rotated either forward and backward in the direction R, the incident angle of the laser beam L on the first prism 13 gradually changes depending on the rotation. Whether the incident angle gradually increases or gradually decreases depends on the direction of rotation of the rotary stage 15. When the incident angle of the laser beam L on the first prism 13 changes in this manner, an emission angle of the laser beam L from the first prism 13 changes. Therefore, an incident angle of the laser beam L on the second prism 14 changes, and as a result, an emission angle of the laser beam L from the second prism 14 changes. FIG. 3 schematically illustrates this action. The laser beam L before the emission angle from the first prism 13 changes is indicated by a solid line, and the laser beam L after the emission angle has changed is indicated by broken lines in FIG. 3. In FIG. 3, the rotary stage 15 is illustrated in a substantially disk shape.

The light emitting module 100 in the present embodiment is applicable, for example, to an optical scan recording apparatus, which uses the laser beam L emitted from the cover 4 in the direction A in FIG. 1, as recording light, an optical scan readout apparatus using the laser beam L as readout light, a processing apparatus using the laser beam L as processing light and an analysis apparatus using the laser beam L as light for analysis. When the light emitting module 100 is applied to the optical scan recording apparatus or the optical scan readout apparatus, the light emitting module 100 is installed in a scan mechanism. The laser beam L emitted from the light emitting module 100 is often passed through a focusing lens (not illustrated in FIG. 1 and FIG. 3) for focusing the laser beam L into a small spot.

It is desirable to accurately set the focus position of the spot at a predetermined position, for example, to improve the accuracy of optical scan and processing. When controlling the focus position with respect to the vertical direction in FIG. 1 and FIG. 3 is requested, it is possible to accurately set the focus position by changing the orientation (travel direction) of the laser bean L emitted from the light emitting module 10 by rotation of the rotary stage 15, as described above. The light emitting module 100 in the present embodiment is applicable not only to a case of controlling the focusing position of a spot, as described above, but naturally also to a case where changing the orientation of the laser beam L emitted from the light emitting module 100, itself, is an ultimate request.

Regarding the focusing spot, in addition to the request for controlling the focus position at a predetermined position, a request for setting and maintaining a spot diameter at a predetermined value also exists. The spot diameter is a beam waist diameter of the laser beam L narrowed by the focusing lens, and depends on the beam diameter of the laser beam L before entering the focusing lens. Therefore, even if the orientation of the laser beam L is changed as described, if the beam diameter of the laser beam L changes as a result, the waist diameter, i.e., the spot diameter also changes. Then, adjustment for setting and maintaining the spot diameter at a predetermined value becomes complicated. To avoid such complicated adjustment, the beam diameter of the laser beam L needs to remain unchanged even if the orientation of the laser beam L changes.

The light emitting module 100 in the present embodiment is also able to satisfy such a request. Specifically, in the first prism 13 and the second prism 14, constituting the prism pair, an apex angle of one of the prisms is positioned on the same side of the optical path of the laser beam L, passing through the prisms, as a base of the other prism, as described already. Therefore, when the beam diameter of the laser beam L emitted from the first prism 13 gradually decreases (increases) depending on rotation of the rotary stage 15, the beam diameter of the laser beam L emitted from the second prism 14 gradually increases (decreases). Since a change in the beam diameter by rotation of the rotary stage 15 is substantially compensated between the two prisms 13, 14, the beam diameter of the laser beam L emitted from the second prism 14 is kept substantially constant. It is possible to set the beam diameter of the laser beam L, which is kept substantially constant, at a desired value by changing the relative angular positional relationship between the first prism 13 and the second prism 14.

Next, the beam diameter of the laser beam L will be described in detail together with specific examples. In the present embodiment, the oscillation wavelength of the laser beam L output from the semiconductor laser 11, illustrated in FIG. 1, is 505 nm. The laser beam L, which is spread light, is collimated by a collimating lens 12. The beam diameters of the collimated laser beam L in a direction parallel to the depicted plane of FIG. 1 and in a direction perpendicular to the depicted plane of FIG. 1 are 1.6 mm and 0.6 mm, respectively. In the present embodiment, the direction parallel to the depicted plane of FIG. 1 and the direction perpendicular to the depicted plane of FIG. 1 are a fast axis direction and a slow axis direction of the semiconductor laser 11, respectively. Therefore, the rotation axis C extends in a direction parallel to the slow axis of the semiconductor laser 11. Note that the described beam diameter and the beam waist diameter, which will be described later, are defined by the diameter of $1/e^2$.

Next, the collimated laser beam L enters the first prism 13, and is refracted in the depicted plane of FIG. 1, and is emitted from the first prism 13. The illustrated two apex angles of the prisms 13, 14 are 45°, and their base material is quartz. The laser beam L emitted from the first prism 13 enters the second prism 14 and is refracted again and emitted from the second prism 14. The laser beam L is emitted from the second prism 14 in such a manner that the beam diameter in a direction parallel to the depicted plane of FIG. 1 decreases, compared with the beam diameter before entering the first prism 13. Specifically, a beam diameter in the aforementioned direction of the laser beam L emitted from the second prism 14 is 0.6 mm. Therefore, the magnification ratio of the beam diameter is 0.38 (=0.6/1.6) times.

Meanwhile, a beam diameter of the laser beam L in a direction perpendicular to the depicted plane of FIG. 1 is neither reduced nor enlarged, and the beam diameter of 0.6 mm before entering the first prism 13 is maintained. Specifically, the laser beam L after passing through the second prism 14 is a perfect circle beam. If this laser beam L is passed through the aforementioned focusing lens to focus the laser beam L into a small spot, the spot is a perfect circle spot. While the laser beam L is passing through the prisms 13, 14, if the rotary stage 15 is rotated, the orientation of the laser beam L emitted from the second prism 14 changes, as described already.

Here, the incident angle of the laser beam L on the first prism 13 is, for example, 12° in a state of having completed adjustment of the orientation of the laser beam L. Further, an anti-reflection coating (AR coat) having a transmittance of 99.5% or higher is applied to an end surface of the first prism 13 that the laser beam L enters. Meanwhile, an end surface of the first prism 13 from which the laser beam L is emitted is a non-coating surface. Therefore, a part of the laser beam L is reflected at the emission end surface at a reflectance of 17%, and the reflection light is guided to the photodetector 9, as described already. An output from the photodetector 9 is used to monitor the light amount of the semiconductor laser 11.

Normally, when the light amount is monitored, laser light obtained by splitting the laser beam L by a beam splitter is often used as monitor light. In contrast, in the present embodiment, the laser beam L is split by adopting a non-coating surface, as one end surface of the first prism 13, a low-cost compact light emitting module is achieved by omitting the beam splitter. When light is split in this manner, an end surface of the first prism 13 that the laser beam enters may be used as an end surface for splitting the light beam. Alternatively, an end surface of the second prism 14 that the laser beam enters or an end surface of the second prism 14 from which the laser beam is emitted may be used.

Next, rotation of the rotary stage 15 will be described in detail. In the present embodiment, the orientation of the laser beam L emitted from the second prism 14 is changeable by ±2° by rotating the rotary stage 15 in the direction R, illustrated in FIG. 3, for ±1°. Therefore, if no other conditions are requested, it is desirable to adjust the orientation of the laser beam L parallel to a base plate 1 by changing the orientation of the laser beam L within this range of ±2°. Then, it becomes possible to propagate the laser beam L having a constant beam height in an optical system after this, and that facilitates handling of the laser beam in optical designing. Alternatively, the direction of the rotation axis C may be shifted by 90° from the depicted state in FIG. 1 so that the laser beam L constantly propagates parallel to the base plate 1 even if the orientation of the laser beam L changes by rotation of the rotary stage 15.

The orientation of the laser beam L having a diameter of 0.6 mm emitted from the second prism 14, as a perfect circle beam, is changeable by about ±2°, and the laser beam L passes through an aperture plate 8. When the laser beam L passes through the aperture plate 8, some of a peripheral portion of the beam is blocked (a loss of about 5 to 10%). The aperture plate 8 is provided to prevent feedback light, which will be described later, from returning to the semiconductor laser 11.

The laser beam L that has passed through the aperture plate 8 enters an attenuator 5 having a transmittance of 50%, and 50% of the beam is reflected and absorbed by a terminator 6 configured by a metal block with a hole having a diameter of 2 mm. The laser beam L that has passed through the attenuator 5 enters an aperture plate 7 attached to the cover 4. The aperture plate 7 has an opening diameter of 1.0 mm, and a loss of the laser beam 1 at the aperture plate 7 is less than 1%. Like the aperture plate 8, the aperture plate 7 is provided to prevent the feedback light from returning to the semiconductor laser 11.

The oscillation wavelength of the semiconductor laser 11 and feedback light returning thereto will be described. Reflection light LR (indicated by dot dashed lines in FIG. 1), induced as described above, returns to the vicinity of the optical path of the laser beam L traveling from the semiconductor laser 11 to an analysis apparatus and the like. The reflection light LR enters the collimating lens 12 in a reverse direction to that of the aforementioned case, and is collected at the vicinity of an active layer of the semiconductor laser 11 to be reabsorbed by the active layer. Therefore, the oscillation is affected. It is well known that the oscillation wavelength of the semiconductor laser 11 changes by this small amount of feedback light. In Raman scattering spectrum, fluorescence analysis and the like, when a semiconductor laser is used as an excitation light source to perform precise measurement, a small change in the oscillation wavelength of the semiconductor laser may cause a problem, such as a change in Raman scattering intensity and a change in fluorescence intensity.

The aperture plates 7, 8 are arranged to prevent this problem. The probability that a component of feedback light travels exactly on the same optical path as that of the laser beam L, which travels to its use position, in a reverse direction to that of the laser beam L is rare, and even if any, the amount of the component is very small. Therefore, it is possible to substantially cut the feedback light component in the vicinity of the optical path at a different angle from that of the laser beam L, which travels to its use position, by arranging the two aperture plate 7, 8 at two different positions from each other. One aperture plate is insufficient to excellently block the feedback light, and aperture plates arranged at at least two positions are needed. The aperture plates may be arranged at three positions. For example, an aperture plate may be provided at one position immediately after the collimating lens 12. The effect of blocking the feedback light is higher as a distance between a plurality of arrangement positions is longer. Further, the opening diameter of the aperture plate 8 may be 0.5, 0.6, 0.7, 0.9 or 1.0 mm besides 0.8 mm. A loss of laser beam L increases as the opening diameter is smaller relative to the beam diameter of 0.6 of the laser beam L, which travels toward its use position, but the effect of blocking the feedback light becomes higher. A similar explanation is applicable to the aperture plate 7, and the opening diameter of the aperture plate 7 may be 0.8 mm, 1.2 mm or the like.

In the present embodiment, the beam diameter of the laser beam L is reduced in one direction by the beam conversion unit. Alternatively, the beam diameter may be enlarged in one direction. The beam diameter may be reduced in one direction and enlarged in the other direction perpendicular to the one direction. Further, in the present embodiment, the beam diameter of the laser beam L is reduced in one direction to make the laser beam L perfectly circular. Alternatively, the beam diameter of the laser beam L may be reduced or enlarged in one direction to make the laser beam L ellipsoid.

Second Embodiment

Figures 4A, 4B:
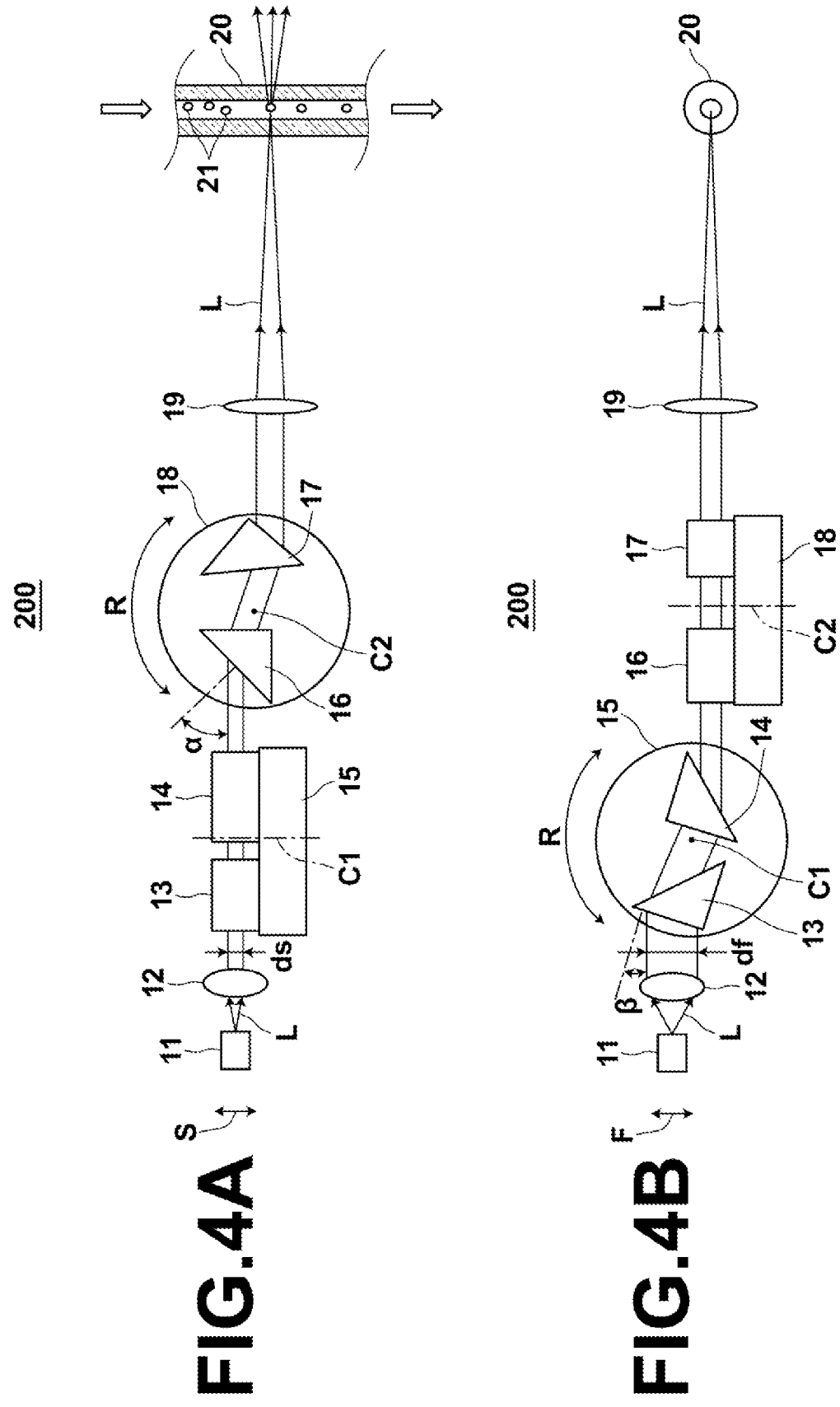
FIG. 4A is a schematic diagram illustrating a side view of a main part of a light emitting module according to a second embodiment of the present disclosure.
FIG. 4B is a schematic diagram illustrating a plan view of the main part of the light emitting module according to the second embodiment of the present disclosure.

FIGS. 4A and 4B illustrate a light emitting module 200 according to a second embodiment of the present disclosure. FIGS. 4A and 4B illustrate a schematic side shape and a schematic plan shape of a part of the beam conversion unit, respectively. The light emitting module 200 in the present embodiment includes two beam conversion units for changing the orientation of the laser beam L, and each of the beam conversion units changes the orientation of the laser beam to directions shifted by 90° from each other. One semiconductor laser 11, as a light source, is also adopted in the light emitting module 200. FIG. 5 illustrates the semiconductor laser 11, and particularly, a schematic perspective shape of its laser diode chip 11c. For example, the laser diode chip 11c has an output power of 60 mW, and outputs laser beam L having the wavelength of 488 nm. In FIGS. 4A and 4B and thereafter, the same numbers as those in FIGS. 1 through 3, which have been described already, are assigned to similar elements, and the explanation on the elements are omitted unless otherwise necessary.

As illustrated in FIG. 5, the laser diode chip 11c outputs the laser beam L from an active layer 11A toward an emission end surface 11B side in a spread light state. The laser beam L is output at spread angle θ//in a slow (Slow) axis direction, which is parallel to the active layer 11A, and at spread angle θ1 in a direction perpendicular to the active layer 11A, i.e., a fast (Fast) axis direction, which is a stacking direction of layers. Here, θ//<θ1 and the latter is normally about two or three times as large as the former. The side shape and the plan shape illustrated in FIGS. 4A and 4B, respectively, are the light emitting module 200 viewed from a direction perpendicular the slow axis direction indicated by arrow S on the emission end surface 11B and from a direction perpendicular to the fast axis direction indicated by arrow F on the emission end surface 11B, respectively.

As illustrated in FIGS. 4A and 4B, the light emitting module 200 in the present embodiment is applied to a flow cytometer. The flow cytometer includes a minute flow cell 20 configured by a capillary tube made of glass, and a plurality of particles 21, as analytes, are caused to flow in the flow cell 20 in the length direction of the flow cell in such a manner to follow one after another. In the flow cytometer, these particles 21 are irradiated with laser beam L from a side of the flow, and scattered light (forward scattered light and side scattered light) or fluorescence induced by the irradiation is detected by a photodetector to obtain an electrical signal, and the particles 21, as one particle or a group of particles, are measured and analyzed based on this electrical signal. The light emitting module 200 in the present embodiment is used to irradiate the particles 21 flowing in the flow cell 20 with the laser beam L, as described above.

As illustrated in FIGS. 4A and 4B, the light emitting module 200 in the present embodiment includes a collimating lens 12 for collimating the laser beam L output from the semiconductor laser 11 in a spread light state, prisms 13, 14, 16 and 17 through which the collimated laser beam L sequentially passes, and a focusing lens 19 for focusing the laser beam L emitted from the prism 17 to focus in the flow cell 20. Here, an aspheric lens is used as the collimating lens 12. Since the aspheric lens is able to obtain a beam closer to a Gaussian beam, compared with a spheric lens, double counting is more effectively prevented.

The prisms 13, 14 are fixed onto a rotary stage 15, which is rotatable in the direction of arrow R, to constitute a prism pair. Similarly, the prisms 16, 17 are fixed onto a rotary stage 18, which is rotatable in the direction of arrow R, to constitute a prism pair. The prism pair including the prisms 13, 14 together with the rotary stage 15 constitutes a first beam conversion unit. The prism pair including the prisms 16, 17 together with the rotary stage 18 constitutes a second beam conversion unit. These beam conversion units have a function of deflecting (changing the orientation of) the laser beam L. Each prism constituting the prism pair also has a function of changing the beam diameter of the laser beam L, but when the beam diameter before entering the prism pair and the beam diameter after being emitted from the prism pair are compared, the beam diameter does not substantially change, as already described.

More specifically, the prism pair including the prisms 13, 14 emits the laser beam L collimated by the collimating lens 12 in such a manner that a beam diameter ds in the slow axis direction is maintained and a beam diameter df in the fast axis direction is reduced. The prism pair including the prisms 13, 14 deflects the laser beam L in such a manner that the travel direction (orientation) of the laser beam L in a plane including the fast axis is changed, and emits the laser beam L.

Meanwhile, the prism pair including the prisms 16, 17 emits the laser beam L, which has been emitted from the prism 14 in such a manner that the beam diameter ds after passing through the collimating lens 12 is maintained in the slow axis direction, so that the beam diameter in the fast axis direction is maintained and the beam diameter in the slow axis direction is enlarged. Further, the prism pair including the prisms 16, 17 deflects the laser beam 1 in such a manner that the travel direction (orientation) of the laser beam L in a plane including the fast axis is changed, and emits the laser beam L.

The apex angle of each of the prisms 13, 14, 16 and 17 is 45°. As these prisms 13, 14, 16 and 17, for example, prisms made of optical glass BK7 may be preferably used, and prisms made of other materials, such as fused quartz, are also adoptable.

After the laser beam L is emitted from the prism 17, the laser beam L focused in the flow cell 20 by the focusing lens 19 irradiates a plurality of particles 21 flowing in the flow cell 20 in the length direction of the flow cell in such a manner to follow one after another. Scattered light (forward scattered light and side scattered light) or fluorescence induced by the irradiation is detected by a photodetector, which is not illustrated. The flow cytometer measures and analyzes the particles 21, as one particle or a group of particles, based on an electrical signal output by the photodetector.

In the laser light emitting module 200 for a flow cytometer in the present embodiment, the laser beam L focused in the flow cell irradiates the inside of the flow cell 20 in such a manner that the length direction of the flow cell 20 (the flow direction of the particles 21) and the slow axis are matched, as clearly illustrated in FIG. 4A. Accordingly, double counting the same one particle 21 is prevented in the flow cytometer. Next, this feature will be described in detail.

The beam waist diameter of the laser beam L at a focus position in the flow cell 20 needs to be sufficiently small to avoid double counting the particles 21 flowing in the flow direction in the flow cell 20 in such a manner to follow one after another. Otherwise, when two particles 21 flow close to each other, they may be counted as one particle. In contrast, the beam waist diameter in a direction perpendicular to the flow direction needs to be large enough to avoid skipping irradiation on the particles 21, which makes the particles 21 uncounted. For example, in many flow cytometers for analyzing minute particles of an organism, as analytes, the former beam waist diameter needs to be about 10 µm or less, and the latter beam waist diameter needs to be about 60 to 100 µm or greater.

Meanwhile, when the laser beam L is focused by the focusing lens 19, the beam waist diameter is smaller as the beam diameter before entering the focusing lens 19 is larger. Specifically, when the laser beam having a wavelength λ is narrowed by a lens having a focal length f, the beam diameter $2\omega$ of the narrowed laser beam is represented as follows:

$$2\omega=4/\pi \cdot f\lambda/D.$$

In view of the foregoing, as recognizable in FIG. 5, it would be desirable to make the fast axis of the laser beam L before focusing matched with the flow direction of particles because the optical system can be simplified. However, a research by the inventor of the present disclosure has found that a beam profile of the laser beam in the fast axis direction tends to have disturbance, such as a protrusion, which causes double counting.

FIGS. 6A through 6D illustrate examples of the beam profiles in the fast axis direction. In FIGS. 6A through 6D, the horizontal axis represents a position in the fast axis direction, and the apex axis represents a beam intensity 1. FIG. 6A illustrates a beam profile of an ideal Gaussian beam shape. Meanwhile, FIG. 6B illustrates a beam profile with two protrusions on both sides of a center of the profile. FIG. 6C illustrates a beam profile with a shoulder at an end of the profile. FIG. 6D illustrates a beam profile with one protrusion at an end of the profile.

When disturbance, such as a protrusion, occurs in a beam profile of a laser beam L along the flow direction of the particles 21 as described above, a detection signal of the detector for detecting scattered light or fluorescence varies due to the disturbance. The variation is recognized as the presence of a particle 21 that is not actually present, and double counting occurs. For example, when two protrusions are present in a beam profile of the laser beam L, one particle 21 may be judged as two particles. Such double counting may occur even when a protrusion with the intensity of about 1 to 2% of the original beam intensity I of the laser beam L is generated.

Based on these findings, in the present embodiment, the slow axis direction of the laser beam L is matched with the flow cell length direction (particle flow direction) in the flow cell 20 by the first beam conversion unit including the prisms 13, 14 and the second beam conversion unit including the prisms 16, 17. As a result, double counting caused by disturbance, such as a protrusion, of the beam profile in the fast axis direction is avoidable.

In the present embodiment, the laser beam L collimated by the collimating lens 12 passes through the focusing lens 19 to focus in the flow cell 20 after the beam diameter in the fast axis direction is reduced and the beam diameter in the slow axis direction is enlarged by the first beam conversion unit and the second beam conversion unit. Specifically, with respect to the slow axis direction, the beam diameter ds of the laser beam L after having passed through the collimating lens 12 is 0.56 mm, and this laser beam L enters the prism 16 at an incident angle α of 56° and the laser beam L with a beam diameter of 3 mm is emitted from the prism 17 (Magnification Ratio Ms=5.4). Since the laser beam L after having passed through the collimating lens 12 perpendicularly enters the first beam conversion unit with respect to the slow axis direction, the beam diameter ds of 0.56 mm is substantially maintained at the same size in the first beam conversion unit.

Meanwhile, with respect to the fast axis direction, the beam diameter df of the laser beam L after having passed through the collimating lens 12 is 1.4 mm, and this laser beam L enters the prism 13 at an incident angle β of 23° and the laser beam L with a beam diameter of 0.5 mm is emitted from the prism 14 (Magnification Ratio Ms=0.36). Since the laser beam L after having passed through the prism 14 perpendicularly enters the second beam conversion unit with respect to the fast axis direction, the beam diameter of 0.5 mm is substantially maintained at the same size in the second beam conversion unit.

Specifically, the laser beam L before entering the focusing lens 19 having a focal length f of 50 mm has a beam diameter of 3 mm in the slow axis direction and a beam diameter of 0.5 mm, which is smaller than 3 mm, in the fast axis direction. As a result, after the laser beam L is narrowed by the focusing lens 19, a beam waist diameter of the laser beam L at the focusing position in the flow cell 20 is 10 µm in the slow axis direction, which is relatively small, and 60 µm in the fast axis direction, which is relatively large.

As described above, in the present embodiment, the beam waist diameter of about 60 to 100 µm or higher in the fast axis direction and the beam waist diameter of about 10 µm or less in the slow axis direction at the focusing position are easily achieved. Since each of the first beam conversion unit and the second beam conversion unit, which can prevent double counting as described above, is configured by a simple prism pair, the present embodiment achieves advantageous effects that the optical system is easily designed, produced and adjusted and the cost of the optical system is low.

When a gas laser or the like other than the semiconductor laser is adopted as the light source and a laser beam having a beam cross-section in a substantially true circle shape is focused in the flow cell 20, a beam waist diameter in the particle flow direction and a beam waist diameter in a direction perpendicular to the particle flow direction may be changed by narrowing the laser beam, for example, by using a cylindrical lens. However, the cylindrical lens is difficult to process and expensive, and complicated adjustment is needed to use the cylindrical lens.

In the present embodiment, the prism pair (prisms 16, 17), as the second beam conversion unit, is fixed onto the rotary stage 18. Therefore, the laser beam L emitted from the second beam conversion unit is deflectable in the slow axis direction by rotating the rotary stage 18 about a rotation axis C2 in the direction of arrow R. Similarly, the prism pair (prisms 13, 14), as the first beam conversion unit, is fixed onto the rotary stage 15. Therefore, the laser beam L emitted from the first beam conversion unit is deflectable in the fast axis direction by rotating the rotary stage 15 about a rotation axis C1 in the direction of arrow R.

Specifically, in the present embodiment, the laser beam L is deflectable in the slow axis direction in such a manner that the orientation of the laser beam L emitted from the second beam conversion unit changes±0.2° by rotating the rotary stage 18 in the direction of arrow R by ±1°. This is also similar in the relationship between the rotation amount of the rotary stage 15 and the orientation of the laser beam L in deflection in the fast axis direction (see FIG. 3, illustrating the first embodiment).

It is possible to adjust the laser beam L so as to focus at a central position in the flow cell 20 by deflecting the laser beam L in the fast axis direction as described above. Further, it is possible to adjust the focusing position of the laser beam L in the particle flow direction by deflecting the laser beam L in the slow axis direction. It is possible to increase the intensity of the scattered light or fluorescence from the particles 21 by making the focusing position of the laser beam L adjustable both in the flow direction of the particles 21 and in a direction orthogonal to this direction, as described above. As a result, it is also possible to increase the intensity of a detection signal from the photodetector, which detects such light. Therefore, it is possible to eliminate variation in signals between individual analytes in the flow cytometer, and to obtain highly reliable detection signals. Alternatively, the laser beam L may be deflectable in only one of the slow axis direction and the fast axis direction.

Third Embodiment

Next, with reference to FIGS. 7A and 7B, a light emitting module in a third embodiment of the present disclosure will be described. The light emitting module in the third embodiment is used as a light source for processing in a laser processing apparatus. The configuration of this light emitting module is similar to that of the laser light emitting module 200 for a flow cytometer, illustrated in FIGS. 4A and 4B, but a target irradiated with the laser beam L is not the flow cell 20, illustrated in FIGS. 4A and 4B, but a portion to be processed by the laser processing apparatus for performing microfabrication.

This laser processing apparatus performs microfabrication on a portion to be processed by two-dimensionally scanning the portion with the laser beam L. FIGS. 7A and 7B illustrate a partial region Ap to be fabricated in the portion to be fabricated, and this region Ap to be fabricated is scanned with the laser beam L in a main scan direction and a sub-scan direction, indicated by broad arrows X and Y, respectively. In FIGS. 7A and 7B, the laser beam L is schematically illustrated by its beam profile. Arrow F, illustrated in FIG. 7A, indicates the fast axis direction of the laser beam L, and arrow S, illustrated in FIG. 7B, indicates the slow axis direction of the laser beam L.

In some kinds of laser processing apparatus, when microfabrication is performed in such a manner that the fast axis is matched with the main scan direction X, as illustrated in FIG. 7A, a sag is generated on a side of the region Ap to be fabricated at a start of scanning in the sub scan direction Y in some cases. This sag forms a linear wrong processing portion, indicated by G in FIG. 7A, as scanning in the sub scan direction continues. A research by the inventor of the present disclosure has found that such a problem is caused by the presence of a protrusion in the beam profile of the laser beam L in the fast axis direction. That is because the problem is avoidable when microfabrication is performed in such a manner that the slow axis is matched with the main scan direction X, as illustrated in FIG. 7B.

Therefore, in the present embodiment, the orientation and the beam diameter of the laser beam L are set by the first beam conversion unit including the prism pair of the prisms 13, 14 and the second beam conversion unit including the prism pair of prisms 16, 17, illustrated in FIGS. 4A and 4B, in such a manner that the slow axis is matched with the main scan direction X and the diameter of the irradiation beam is sufficiently small in the main scan direction X (i.e., the beam diameter of the laser beam before entering the focusing lens 19 is sufficiently large). As a result, the aforementioned problem is avoidable.

Fourth Embodiment

Next, with reference to FIG. 8, a light emitting module in a fourth embodiment of the present disclosure will be described. The light emitting module in the fourth embodiment is used as a light source for recording in a recording apparatus. The configuration of this light emitting module is similar to that of the laser light emitting module 200 for a flow cytometer, illustrated in FIGS. 4A and 4B, but a target irradiated with the laser beam L is not the flow cell 20, illustrated in FIGS. 4A and 4B, but a recording medium, such as an optical disk, on which pits for carrying information are formed.

This recording apparatus for forming pits on a recording medium forms pits by two-dimensionally scanning a surface of the recording medium with the laser beam L emitted from the light emitting module. Specifically, as schematically illustrated in FIG. 8, the surface of the recording medium is scanned with the laser beam L in the main scan direction and the sub scan direction, indicated by broad arrows X, Y, respectively. In FIG. 8, the laser beam L is schematically illustrated by its beam profile, Further, arrow F, illustrated in FIG. 8, indicates the fast axis direction of the laser beam L.

In some kinds of recording medium, when a pit P is formed in such a manner that the fast axis is matched with the main scan direction X, as illustrated in FIG. 8, an unwanted partial pit Pf is formed toward the back side of the pit P in the scan direction in some cases. This partial pit Pf may cause an error in readout when a correct pit P is read from the recording medium. A research by the inventor of the present disclosure has found that formation of such a partial pit Pf is caused by the presence of a protrusion in the beam profile of the laser beam L in the fast axis direction. That is because the partial pit Pf is not formed when the pit P is formed in such a manner that the slow axis is matched with the main scan direction X.

Therefore, in the present embodiment, the orientation and the beam diameter of the laser beam L is set by the first beam conversion unit including the prism pair of prisms 13, 14 and the second beam conversion unit including the prism pair of prisms 16, 17, illustrated in FIGS. 4A and 4B, in such a manner that the slow axis is matched with the main scan direction X and the diameter of the irradiation beam is sufficiently small in the main scan direction X (i.e., the beam diameter of the laser beam before entering the focusing lens 19 is sufficiently large). As a result, the formation of the partial pit Pf is avoidable.

15

16

What is claimed is:

1. A light emitting module comprising:

a semiconductor laser;

a collimating lens that collimates light beam output from the semiconductor laser in a beam spread state;

a first prism pair including two triangular-plate-shaped prisms, each passing the light beam between two end surfaces on both sides of one apex angle to refract the light beam, and the prisms being sequentially arranged on an optical path of the collimated light beam in such a manner that the orientations of apex angles of the prisms are opposite to each other;

a first rotary stage configured to hold the first prism pair and to be rotatable about a rotation axis extending in a prism thickness direction in such a manner that an incident angle of the collimated light beam entering a prism positioned on the upstream side of the optical path is changed; and two aperture plates;

wherein each of the two aperture plates comprises a light-blocking member with a circular aperture formed therein to allow the passage of the parallel light, and blocks at least a portion of a return light which is emitted from the semiconductor laser, reflected externally, and then travels toward the semiconductor laser, and wherein the two aperture plates are arranged such that their positions along the direction of propagation of the reflected light are different from each other.

2. The light emitting module, as defined in claim 1, further comprising:

a focusing lens that focuses the light beam emitted from the prism pair.

3. The light emitting module, as defined in claim 1, further comprising:

an attenuator that attenuates the light beam emitted from the prism pair.

4. The light emitting module, as defined in claim 1, further comprising:

a temperature adjustment unit for a semiconductor laser, and which is configured to change an oscillation wavelength of the semiconductor laser.

5. The light emitting module, as defined in claim 1, further comprising:

a photodetector configured to detect light output from the semiconductor laser, wherein one of end surfaces of the two prisms, and through which the light beam pass, is used as a reflection surface for guiding the light beam reflected at the end surface to the photodetector.

6. The light emitting module, as defined in claim 1, further comprising:

a second prism pair including two triangular-plate-shaped prisms, each passing the light beam between two end surfaces on both sides of one apex angle to refract the light beam, and the prisms being sequentially arranged on an optical path of the collimated light beam in such a manner that the orientations of apex angles of the prisms are opposite to each other; and a second rotary stage configured to hold the second prism pair and to be rotatable about a rotation axis extending in a prism thickness direction in such a manner that an incident angle of the collimated light beam entering a prism positioned on the upstream side of the optical path is changed, wherein the two sets of the prism pair and the rotary stage are arranged along the optical path of the collimated light beam, and wherein a rotation axis of one of the rotary stages is perpendicular to a direction parallel to a rotation axis of the other rotary stage.

7. The light emitting module, as defined in claim 6, wherein the rotation axis of the one of the rotary stages is parallel to a fast axis or a slow axis of the light beam entering the prism pair.

* * * * *